(12) United States Patent
Linardy et al.

(10) Patent No.: US 12,266,671 B2
(45) Date of Patent: Apr. 1, 2025

(54) PHOTODETECTORS WITH A DEEP TRENCH ISOLATION REGION THAT INCLUDES A BRAGG MIRROR

(71) Applicant: GLOBALFOUNDRIES Singapore Pte. Ltd., Singapore (SG)

(72) Inventors: Eric Linardy, Singapore (SG); Eng Huat Toh, Singapore (SG); Ping Zheng, Singapore (SG); Kiok Boone Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 656 days.

(21) Appl. No.: 17/507,213

(22) Filed: Oct. 21, 2021

(65) Prior Publication Data
US 2023/0131505 A1    Apr. 27, 2023

(51) Int. Cl.
*H01L 27/146* (2006.01)
*H10F 39/00* (2025.01)
*H10F 39/18* (2025.01)

(52) U.S. Cl.
CPC ....... *H10F 39/8067* (2025.01); *H10F 39/011* (2025.01); *H10F 39/024* (2025.01); *H10F 39/18* (2025.01); *H10F 39/8063* (2025.01); *H10F 39/807* (2025.01)

(58) Field of Classification Search
CPC ............. H01L 27/1463; H01L 27/1464; H01L 27/14643
See application file for complete search history.

(56) References Cited

U.S. PATENT DOCUMENTS

| | | | | |
|---|---|---|---|---|
| 9,728,570 | B2* | 8/2017 | Chiang | H01L 27/14621 |
| 10,438,987 | B2* | 10/2019 | Mandai | H04N 25/75 |
| 10,672,818 | B2* | 6/2020 | Tanaka | H01L 31/02327 |
| 11,482,562 | B2* | 10/2022 | Chen | H01L 27/1464 |
| 11,621,363 | B2* | 4/2023 | Mamdy | H01L 31/02327 |
| | | | | 257/186 |
| 11,811,000 | B2* | 11/2023 | Chen | H01L 33/24 |
| 2007/0090892 | A1* | 4/2007 | Larson, III | H03H 9/587 |
| | | | | 333/24.2 |

(Continued)

OTHER PUBLICATIONS

Martin A. Green, "Self-consistent optical parameters of intrinsic silicon at 300K including temperature coefficients, Solar Energy Materials and Solar Cells", vol. 92, Issue 11, 2008, pp. 1305-1310.

(Continued)

*Primary Examiner* — Jeff W Natalini
*Assistant Examiner* — Alexander Belousov
(74) *Attorney, Agent, or Firm* — Thompson Hine LLP; Anthony Canale (57) ABSTRACT

Structures for a photodetector and methods of forming a structure for a photodetector. The structure includes a semiconductor layer having a p-n junction and a deep trench isolation region extending through the semiconductor layer. The deep trench isolation region includes first layers and second layers that alternate with the first layers to define a Bragg mirror. The first layers contain a first material having a first refractive index, and the second layers contain a second material having a second refractive index that is greater than the first refractive index.

20 Claims, 5 Drawing Sheets

(56) References Cited

U.S. PATENT DOCUMENTS

| | | | | |
|---|---|---|---|---|
| 2014/0191115 | A1* | 7/2014 | Webster | H01L 31/107 250/214 R |
| 2019/0219248 | A1* | 7/2019 | Patent | F21S 41/176 |
| 2019/0252442 | A1* | 8/2019 | Tanaka | H01L 27/14636 |
| 2020/0279969 | A1* | 9/2020 | Wang | H01L 27/1469 |
| 2021/0126149 | A1* | 4/2021 | Mamdy | H01L 31/02027 |
| 2022/0208829 | A1* | 6/2022 | Chen | H01L 27/14685 |
| 2022/0209061 | A1* | 6/2022 | Chen | H01L 33/46 |
| 2023/0131505 | A1* | 4/2023 | Linardy | H01L 27/14629 257/432 |

OTHER PUBLICATIONS

Luis V. Rodríguez-de Marcos, Juan I. Larruquert, José A. Méndez, and Jose A. Aznárez, "Self-consistent optical constants of SiO2 and Ta2O5 films," Opt. Mater. Express 6, 3622-3637 (2016).

Rémi Boidin, et al., "Pulsed laser deposited alumina thin films", Ceramics International, vol. 42, Issue 1, Part B, 2016, pp. 1177-1182.

M.F. Al-Kuhaili, "Optical properties of hafnium oxide thin films and their application in energy-efficient windows", Optical Materials, vol. 27, Issue 3, 2004, pp. 383-387.

Siefke, et al., "Materials Pushing the Application Limits of Wire Grid Polarizers further into the Deep Ultraviolet Spectral Range" Advanced Optical Materials, vol. 4, Issue 11, Nov. 2016, pp. 1780-1786.

J. M. Pavia, et al., "A 1x400 Backside-Illuminated SPAD Sensor With 49.7 ps Resolution, 30 pJ/Sample TDCs Fabricated in 3D CMOS Technology for Near-Infrared Optical Tomography," in IEEE Journal of Solid-State Circuits, vol. 50, No. 10, pp. 2406-2418, Oct. 2015.

T. Al Abbas, et al., "Backside illuminated SPAD image sensor with 7.83μm pitch in 3D-stacked CMOS technology," 2016 IEEE International Electron Devices Meeting (IEDM), 2016, pp. 8.1.1-8.1.4.

Sedrati, et al., "Tuning of the stop-band position in the visible range of SiO2/TiO2 Bragg reflectors by doping TiO2 with transition metals", Optik, vol. 208, 2020, 164098, ISSN 0030-4026.

Ivanov et al. "Thin silicon solar cells with SiOx/SiNx Bragg mirror rear surface reflector", Semiconductor Physics Quantum Electronics & Optoelectronics, 2009, T. 12, No. 4., 406-411.

M. Y. Kuo, et al., "Quantum efficiency enhancement in selectively transparent silicon thin film solar cells by distributed Bragg reflectors," Opt. Express 20, A828-A835 (2012).

Dubey, et al., "Fabrication and characterization of TiO2/SiO2 based Bragg reflectors for light trapping applications", Results in Physics, vol. 7, 2017, pp. 2271-2276.

Mitra, et al., "Improvement of photon management in partial rear contact solar cells using a combination of DBR and Mie scatterers", Optics Communications, vol. 397, 2017, pp. 1-9.

Yepuri, et al., "Rapid and economic fabrication approach of dielectric reflectors for energy harvesting applications", Sci Rep 10, 15930 (2020).

* cited by examiner

PHOTODETECTORS WITH A DEEP TRENCH ISOLATION REGION THAT INCLUDES A BRAGG MIRROR

BACKGROUND

The present invention relates to semiconductor device fabrication and integrated circuits and, more specifically, to structures for a photodetector and methods of forming a structure for a photodetector.

A single-photon avalanche diode (SPAD) is a type of solid-state photodetector belonging to the same family as photodiodes and avalanche photodiodes. A fundamental difference between single-photon avalanche diodes and other types of photodetectors is that a single-photon avalanche diode is biased well above its reverse-bias breakdown voltage. When a single-photon avalanche diode is placed under such a high reverse bias, photon-initiated charge carriers are accelerated by the electric field to a kinetic energy that is large enough to knock electrons out of atoms of the bulk material and generate additional charge carriers that may exponentially grow to generate an avalanche of charge carriers. A single-photon avalanche diode can detect single photons providing short duration current pulses that can be counted or used to obtain a time of arrival of a particular incident single photon.

Instances of the single-photon avalanche diode may be arranged as pixels in a pixel array to define an image sensor. The image sensor may be used in mobile phones, digital cameras, time-of-flight sensors, and other types of devices. Deep trench isolation regions are used to electrically and optically isolate the instances of the single-photon avalanche diode in the pixel array. A conventional deep trench isolation region, which includes a metallic reflector core for optical isolation, may provide less than optimal isolation and its fabrication process may lead to metallic contamination leading to high dark current, poor low-light sensitivity, and diminished signal-to-noise ratio.

Improved structures for a photodetector and methods of forming a structure for a photodetector are needed.

SUMMARY

In an embodiment of the invention, a structure for a photodetector is provided. The structure includes a semiconductor layer having a p-n junction and a deep trench isolation region extending through the semiconductor layer. The deep trench isolation region includes a first plurality of layers and a second plurality of layers that alternate with the first plurality of layers to define a Bragg mirror. The first plurality of layers comprise a first material having a first refractive index, and the second plurality of layers comprise a second material having a second refractive index that is greater than the first refractive index.

In an embodiment of the invention, a method of forming a structure for a photodetector is provided. The method includes forming a trench extending through a semiconductor layer having a p-n junction, and forming a deep trench isolation region in the trench that includes a first plurality of layers and a second plurality of layers that alternate with the first plurality of layers to define a Bragg mirror. The first plurality of layers comprise a first material having a first refractive index, and the second plurality of layers comprise a second material having a second refractive index that is greater than the first refractive index.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 4A is a top view in which FIG. 4 is taken generally along line 4-4.

DETAILED DESCRIPTION

Figure 1:
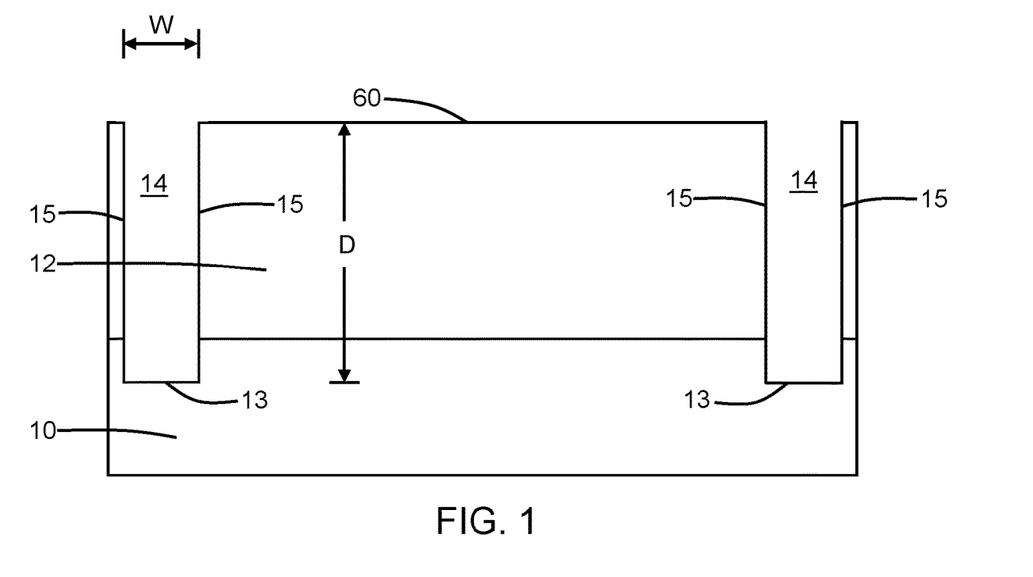
FIG. 1 is a cross-sectional view of a structure at an initial fabrication stage of a processing method in accordance with embodiments of the invention.

With reference to FIG. 1 and in accordance with embodiments of the invention, a semiconductor substrate 10 is provided that contains a semiconductor material, such as single-crystal silicon. In an embodiment, the semiconductor substrate 10 may contain single-crystal silicon that is heavily-doped with a p-type dopant (e.g., boron) to provide p-type conductivity. A semiconductor layer 12 is formed on the semiconductor substrate 10. The semiconductor layer 12 may be comprised of a semiconductor material, such as single-crystal silicon, that is grown as a blanket film using an epitaxial growth process. In an embodiment, the semiconductor layer 12 may comprise single-crystal silicon that is doped to have p-type conductivity with a dopant concentration that is less than a dopant concentration of the semiconductor substrate 10. In an embodiment, the semiconductor substrate 10 may have a dopant concentration ranging from about $1 \times 10^{18}$ cm$^{-3}$ to about $1 \times 10^{20}$ cm$^{-3}$, and the semiconductor layer 12 may have a significantly lower dopant concentration ranging from about $1 \times 10^{14}$ cm$^{-3}$ to about $1 \times 10^{17}$ cm$^{-3}$. In an embodiment, the epitaxially-grown semiconductor layer 12 may have a thickness of about 3 microns (μm) to about 7 μm.

A trench 14 is formed as an opening that penetrates fully through the semiconductor layer 12 and to a shallow depth into the semiconductor substrate 10. The trench 14 surrounds respective portions of the semiconductor substrate 10 and the semiconductor layer 12 that eventually define an absorption/multiplication region of a single-photon avalanche diode. The trench 14 has a bottom 13 that is located in the semiconductor substrate 10 and sidewalls 15 that extend from a surface 60 of the semiconductor layer 12 to the bottom 13.

The trench 14 may be patterned in the semiconductor layer 12 and semiconductor substrate 10 by lithography and etching processes. To that end, an etch mask may be formed by a lithography process over the semiconductor layer 12. The etch mask may include a layer of photoresist applied by a spin-coating process, pre-baked, exposed to light projected through a photomask, baked after exposure, and developed with a chemical developer to define an opening at the location of the subsequently-formed trench 14. An etching process is used to form the trench 14 at the location of the opening in the etch mask. In an embodiment, the trench 14 may have a width W of about 0.2 μm to about 1 μm, which may be selected to optimize the optical isolation provided by a Bragg mirror subsequently formed in the trench 14, and a depth D in a range of about 5 μm to about 10 μm. The etch mask may be stripped by, for example, ashing after forming the trench 14.

Figure 2:
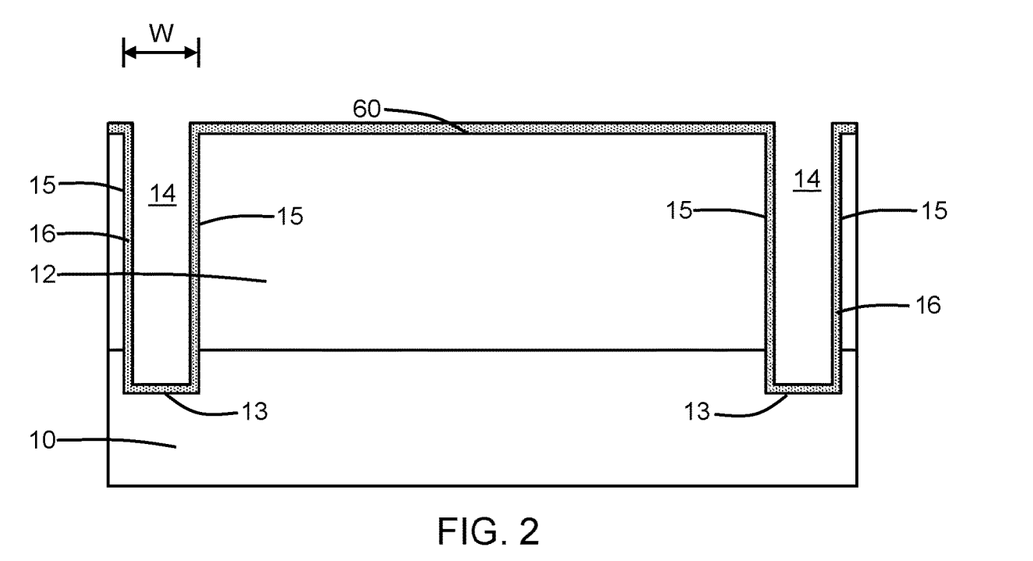
FIG. 2 is a cross-sectional view of the structure at a fabrication stage subsequent to FIG. 1.

With reference to FIG. 2 in which like reference numerals refer to like features in FIG. 1 and at a subsequent fabrication stage of the processing method, a pinning layer 16 may be epitaxially grown as a layer of semiconductor material from the semiconductor layer 12 and semiconductor substrate 10 at the bottom 13 and sidewalls 15 of the trench 14. In an embodiment, the semiconductor material forming the pinning layer 16 may be in situ doped during epitaxial growth and may have a single-crystal crystal structure. In an embodiment, the pinning layer 16 may be doped to contain a p-type dopant (e.g., boron) that provides p-type conductivity. In an embodiment, the pinning layer 16 may be heavily doped with the p-type dopant with a dopant concentration ranging from about $1\times10^{18}$ cm$^{-3}$ to about $1\times10^{21}$ cm$^{-3}$. In an alternative embodiment, the pinning layer 16 may be formed by deposition of doped polysilicon (e.g., p-type polysilicon) that is annealed by a pulsed laser anneal or a rapid thermal anneal to crystalize the polysilicon and activate the dopant. In an alternative embodiment, the pinning layer 16 may be formed by angled sidewall implantation of ions containing a p-type dopant (e.g., boron) into the semiconductor material of the semiconductor layer 12 and semiconductor substrate 10 at the bottom 13 and sidewalls 15 of the trench 14.

Figure 3:
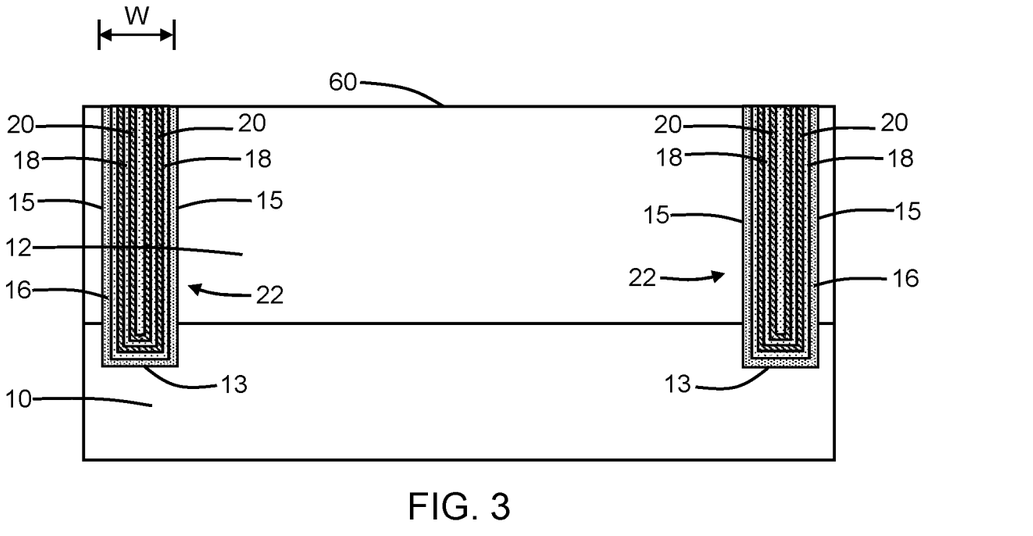
FIG. 3 is a cross-sectional view of the structure at a fabrication stage subsequent to FIG. 2.

With reference to FIG. 3 in which like reference numerals refer to like features in FIG. 2 and at a subsequent fabrication stage of the processing method, a deep trench isolation region 22 in the form of a Bragg mirror (or Bragg reflector) includes layers 18 and layers 20 positioned inside the trench 14. The layers 18 may alternate with the layers 20 across the width W of the trench 14 such that the layers 18 are interleaved with the layers 20 to provide a multilayer stack. Layer pairs of the layers 18, 20 define periods of the Bragg mirror constituting the deep trench isolation region 22. In that regard, the periods defined by the layer pairs may have a periodic arrangement across the width W of the trench 14. In an embodiment, the optimal thickness (t) of the layer 18 or the thickness (t) of the layer 20 may depend on a target center wavelength (λ) of the Bragg mirror as described by:

$$t = \frac{\lambda}{4n \cdot \cos(\theta)}$$

where the refractive index (n) is either the refractive index of the layers 18 or the refractive index of the layers 20, and cos(θ) accounts for the optical path length variation of light at different incident angles. Here, the thickness t corresponds the one-quarter wavelength of light with wavelength A in a medium with refractive index n such that, at the interface in each layer, the incident light is reflected. In an embodiment, for light with a wavelength in the visible or near infrared spectrum, the thickness of the layers 18 may range from about 20 nanometers (nm) to about 500 nm, and the thickness of the layers 20 may also range from about 20 nanometers (nm) to about 500 nm.

The layers 18, 20 of the deep trench isolation region 22 are formed on the pinning layer 16 at the bottom 13 and sidewalls 15 of the trench 14. The layers 18, 20 may extend down the sidewalls 15 of the trench 14 and across the bottom 13 of the trench 14 to provide a U-shape. The pinning layer 16 is arranged between the layers 18, 20 of the deep trench isolation region 22 and the semiconductor substrate 10 over a lower portion of the trench 14 and between the layers 18, 20 of the deep trench isolation region 22 and the semiconductor layer 12 over an upper portion of the trench 14.

In an embodiment, the layers 18, 20 of the deep trench isolation region 22 may be formed inside the trench 14 by various deposition methods including chemical vapor deposition, atomic layer deposition, or molecular beam epitaxy. The layers 18, 20 progressively narrow the space inside the trench 14 with each successive deposition and eventually fully fill the trench 14. Extraneous portions of the layers 18, 20, as well as extraneous portions of the pinning layer 16, may be removed by planarization (e.g., chemical-mechanical planarization) from the surface 60 of the semiconductor layer 12.

The material constituting the layers 18 of the deep trench isolation region 22 may differ in composition from the material constituting the layers 20 of the deep trench isolation region 22. The compositional difference between the layers 18 and the layers 20 provides a refractive index contrast, such as a refractive index contrast produced by a difference in the real part of their respective refractive indices (i.e., indices of refraction). The total reflectivity (R) of the Bragg mirror for a specific number of periods provided by layer pairs (P) of layers 18, 20 is dependent on the refractive indices of the materials constituting both layers 18, 20 ($n_1$, $n_2$) and the refractive indices of the portions of the pinning layer 16 on opposite sides of the sidewalls 15 in front of ($n_i$), and behind ($n_t$), the multilayer stack of the Bragg mirror according to equation:

$$R = \left( \frac{1 - n_t/n_i (n_1/n_2)^{2P}}{1 + n_t/n_i (n_8/n_2)^{2P}} \right)^2$$

The reflectivity bandwidth is also determined by the refractive index contrast of the materials contained in the layers 18, 20 and the number of layer pairs (P). The width W of the trench 14 may depend upon the number of layer pairs (P) needed to achieve specific target reflectivity R. The higher the number of layer pairs (P), the higher the target reflectivity R at the expense of increasing width W of deep trench isolation region 22 which may reduce the optically active area and therefore, the effective fill factor.

The layers 18, 20 may comprise materials with different compositions and, therefore, different refractive indices. The layers 18 and the layers 20 may be comprised of different dielectric materials characterized by a refractive index contrast. In an embodiment, the dielectric material comprising the layers 18 may be an oxide, and the dielectric material comprising the layers 20 may also be an oxide of different composition. In an embodiment, the materials for the layers 18, 20 may be selected from silicon dioxide, aluminum oxide, hafnium oxide, tantalum oxide, or titanium oxide. In an embodiment, the layers 18 may be comprised of silicon dioxide, and the layers 20 may be comprised of aluminum oxide, hafnium oxide, titanium oxide, or tantalum oxide. For example, at a wavelength of 940 nm, silicon dioxide may have a refractive index of about 1.46, and aluminum oxide, hafnium oxide, titanium oxide, or tantalum oxide may have respective refractive indices of about 1.67, about 1.88, about 2.32, and about 2.17 that are each greater than the refractive index of silicon dioxide to provide the refractive index contrast.

In an alternative embodiment, the material for the layers 20 may be comprised of a semiconductor material, and the material for the layers 18 may be comprised of a dielectric material. In an alternative embodiment, the material for the layers 20 may be comprised of silicon, and the material for the layers 18 may be comprised of a dielectric material selected from silicon dioxide, aluminum oxide, hafnium oxide, tantalum oxide, or titanium oxide. In an alternative embodiment, the layers 18 may be comprised of an electrically-insulating material having a low refractive index, such as epitaxial magnesium fluoride, lithium fluoride and calcium fluoride, and the layers 20 may be comprised of a material having a higher refractive index, such as oxides and semiconductor materials.

In an embodiment, the pinning layer 16 may be comprised of a semiconductor material (e.g., silicon) having a refractive index that is greater than either the refractive index of the layers 18 or the refractive index of the layers 20. In an embodiment, the semiconductor layer 12 may be comprised of a semiconductor material (e.g., silicon) having a refractive index that is greater than either the refractive index of the layers 18 or the refractive index of the layers 20.

Figure 4:
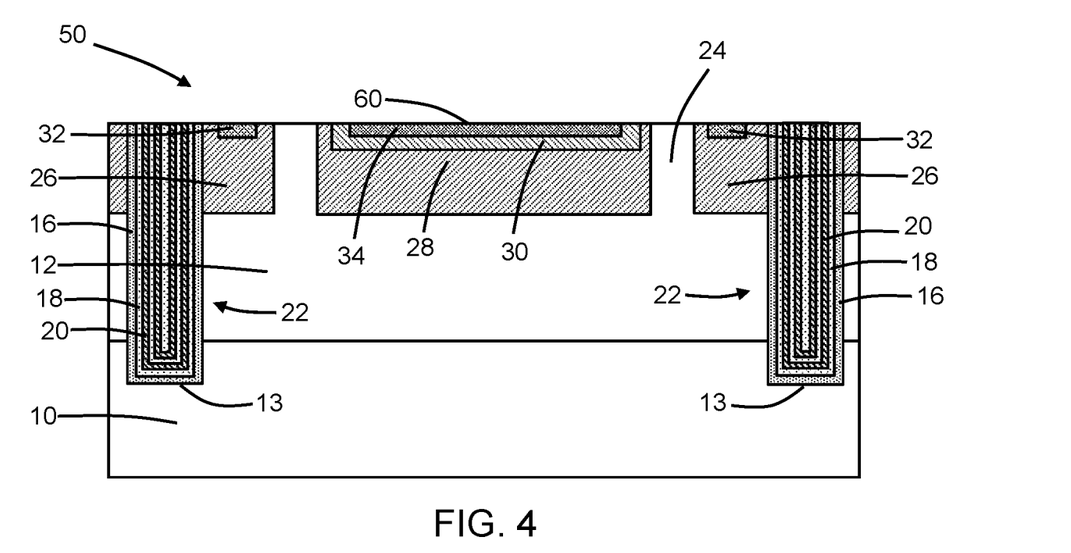
FIG. 4 is a cross-sectional view of the structure at a fabrication stage subsequent to FIG. 3.
Figure 4A:
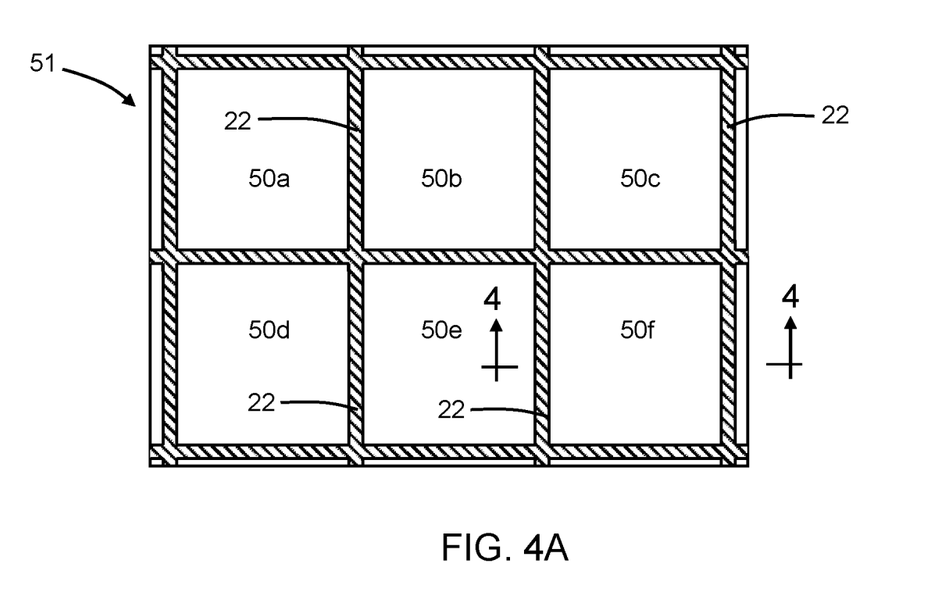

With reference to FIGS. 4, 4A in which like reference numerals refer to like features in FIG. 3 and at a subsequent fabrication stage of the processing method, deep wells 26, 28 and a shallow well 30 are formed in the semiconductor layer 12 adjacent to the surface 60 of the semiconductor layer 12. In an embodiment, the deep well 26 may be formed in a peripheral portion of the semiconductor layer 12 and may surround a central portion of the semiconductor layer 12. The deep well 28 and shallow well 30 may be formed in the central portion of the semiconductor layer 12. The deep wells 26, 28 and shallow well 30 may be formed by separate masked ion implantations. In an alternative embodiment, the deep well 28 may be omitted from the device construction.

The shallow well 30 is positioned in a vertical direction between the deep well 28 and the surface 60 of the semiconductor layer 12, and the shallow well 30 may be embedded in the deep well 28 beneath the surface 60 of the semiconductor layer 12. The deep well 28 and the shallow well 30 may be doped to have opposite conductivity types. In an embodiment, the semiconductor material constituting the deep wells 26, 28 may contain a p-type dopant (e.g., boron) that provides p-type conductivity, and the semiconductor material constituting the shallow well 30 may contain an n-type dopant (e.g., arsenic or phosphorus) that provides n-type conductivity. The shallow well 30 adjoins the deep well 28 along a p-n junction that, during operation of the single-photon avalanche diode, may be reversed biased. A guard ring 24, which is provided by a portion of the semiconductor layer 12 laterally arranged between the deep well 26 and the deep well 28, surrounds the deep well 28 and shallow well 30.

A doped region 32 may be formed in a portion of the deep well 26, and a doped region 34 may be formed in a central portion of the shallow well 30. The doped region 32 may be heavily-doped to have the same conductivity type as, and a higher dopant concentration than, the deep well 26. The doped region 34 may be heavily-doped to have the same conductivity type as, and a higher dopant concentration than, the shallow well 30. The doped regions 32, 34 may be formed by respective masked ion implantation processes.

The doped regions 32, 34 may serve as respective contact diffusions for the anode and cathode contacts to the single-photon avalanche diode.

The resulting structure 50 is a single-photon avalanche diode that may be capable of sensing low levels of light. As shown in FIG. 4A, the deep trench isolation region 22 may be included in a grid of deep trench isolation regions 22 for a pixel array in which each grid square includes an instance of a structure 50 defining a pixel of a single-photon avalanche diode device 51, such as an image sensor. In that regard, the structure 50 may be replicated to provide multiple instances 50*a*-50*f* (FIG. 4A) of the single-photon avalanche diode, and these instances 50*a-f* of the single-photon avalanche diode may be arranged as pixels in the pixel array. The instances of the 50*a-f* of the single-photon avalanche diode provide an array of p-n junctions with the deep trench isolation regions 22 isolating individual p-n junctions throughout the semiconductor layer 12. The single-photon avalanche diode device 51 may be deployed in an image sensor found in mobile phones, digital cameras, time-of-flight sensors, and other types of devices.

Figure 5:
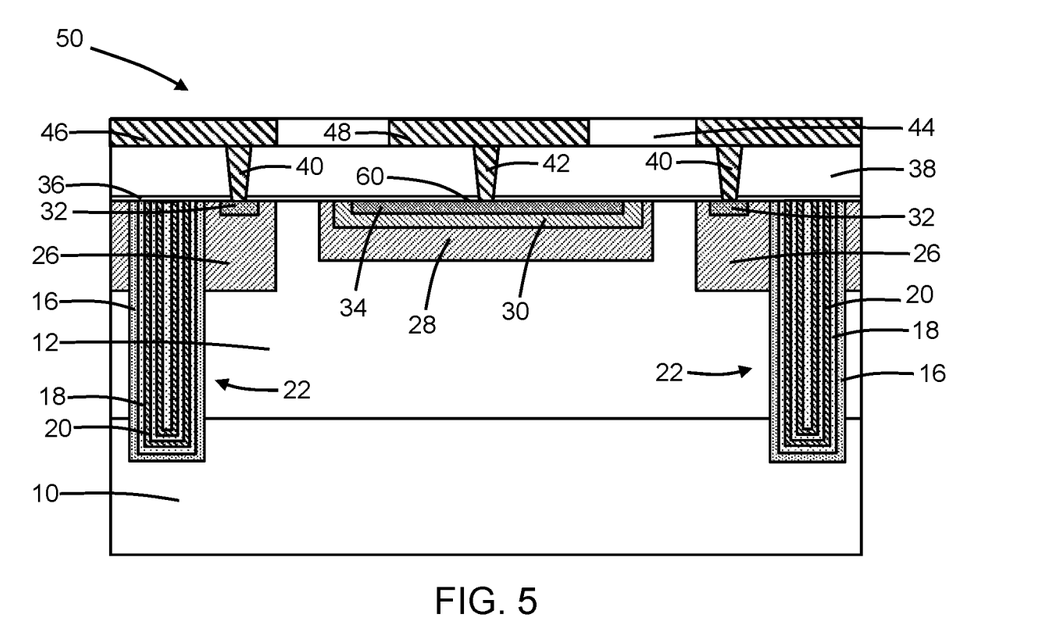
FIG. 5 is a cross-sectional view of the structure at a fabrication stage subsequent to FIG. 4.

With reference to FIG. 5 in which like reference numerals refer to like features in FIG. 4 and at a subsequent fabrication stage of the processing method, a dielectric layer 36 is formed on the surface 60 of the semiconductor layer 12. The dielectric layer 36 may comprise a dielectric material, such as silicon nitride, or a combination of dielectric materials, such as a layered combination of silicon dioxide and silicon nitride. The dielectric layer 36 may function as an etch stop layer. An interlayer dielectric layer 38 is deposited on the dielectric layer 36. The interlayer dielectric layer 38 may comprise a dielectric material, such as silicon dioxide, that is deposited by chemical vapor deposition. Contacts 40, 42 are formed that are respectively coupled to the doped regions 32, 34. The contacts 40, 42 may be formed by patterning contact openings that extend through the interlayer dielectric layer 38 to the respective doped regions 32, 34, and then filling the contact openings with portions of a metal layer that is deposited and planarized.

An interlayer dielectric layer 44 is formed on the interlayer dielectric layer 38. The interlayer dielectric layer 44 may be comprised of dielectric material, such as silicon dioxide. Wires 46, 48 are formed defining metal features that are physically and electrically connected by the contacts 40, 42 to the doped regions 32, 34. The wires 46, 48 may be metal features of a back-end-of-line interconnect structure and may be formed in the interlayer dielectric layer 44 by a damascene process or as part of a dual-damascene process.

Figure 6:
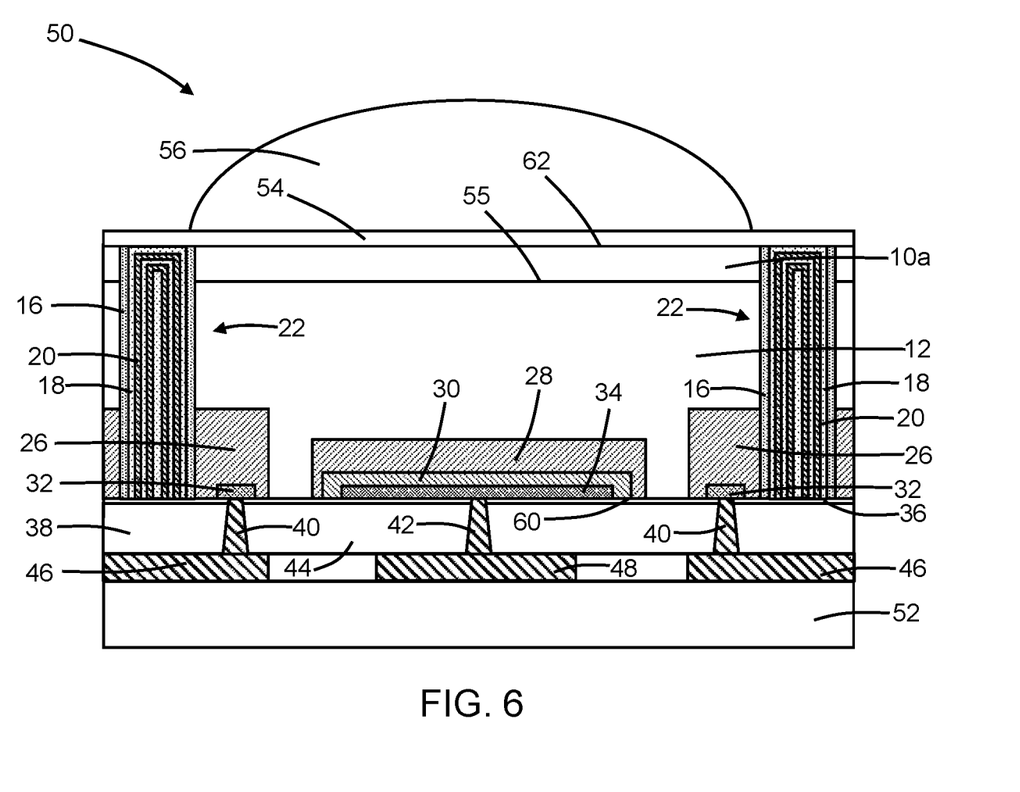
FIG. 6 is a cross-sectional view of the structure at a fabrication stage subsequent to FIG. 5.

With reference to FIG. 6 in which like reference numerals refer to like features in FIG. 5 and at a subsequent fabrication stage of the processing method, the structure 50 may be flipped and then joined with other semiconductor devices, such as complementary metal-oxide semiconductor (CMOS) logic chip 52, to initiate formation of a back-side illuminated single-photon avalanche diode. The bonding process may be performed using, for example, direct bonding or a fusion bonding process. An image sensor constructed from an array of the back-side illuminated structures 50 may have a significantly larger fill factor compared to a conventional front-side illuminated image sensor.

After flipping and bonding, the semiconductor substrate 10 may be thinned by, for example, chemical-mechanical polishing and wet etching from its backside. The thinning may be limited and controlled in terms of material removal such that the semiconductor substrate 10 is not fully removed and, as a result, such that a portion of the semiconductor substrate 10 remains as a residual semiconductor layer 10a. Alternatively, the semiconductor substrate 10 may be fully removed during the thinning process, and the semiconductor layer 10a can be formed either in the semiconductor layer 12 by ion implantation or by epitaxial growth from the semiconductor layer 12. The semiconductor layer 10a and the semiconductor layer 12 are coextensive along an interface 55 between the semiconductor layer 10a and the semiconductor layer 12.

The structure 50 includes an anode provided by the semiconductor layer 10a, the semiconductor layer 12, and the deep well 28. The structure 50 includes a cathode provided by the shallow well 30. The surrounded portions of the semiconductor layers 10a, 12 define an absorption/multiplication region of the structure 50. In an alternative embodiment, the conductivity types of the semiconductor substrate 10 and semiconductor layer 12 may be swapped, as well as the conductivity types of the anode and cathode.

The pinning layer 16 is electrically and physically coupled to the deep well 26. The pinning layer 16 may be contacted via the deep well 26 to facilitate biasing to control the electric field within the peripheral portions of the semiconductor layers 10a, 12 to improve the sensitivity of the structure 50.

The semiconductor layer 10a defines a buried layer with a high doping level (e.g., heavily-doped p-type conductivity). The semiconductor layer 10a and the semiconductor layer 12 are doped to have the same conductivity type, and the dopant concentration in the semiconductor layer 10a is greater than the dopant concentration in the semiconductor layer 12.

After flipping and thinning, a coating 54 and a micro-lens 56 may be formed on a surface 62 of the semiconductor layer 10a. The coating 54 may include an anti-reflection layer, a passivation layer (e.g., tantalum oxide), and an optical filter arranged in a layer stack. In such a backside illuminated structure, the micro-lens 56 may function to focus incident light toward the absorption/multiplication region of the single-photon avalanche diode. The micro-lens 56 may be comprised of a polymer, such as reflowed photoresist.

The deep trench isolation region 22, which includes a series of alternating layers 18, 20 as thin films inside the trench 14, differs from the metal core of conventional deep trench isolation regions. The deep trench isolation region 22 electrically and optically isolates the anode and cathode of the structure 50 from adjacent instances of the structure 50 in the pixel array. The isolation afforded by the deep trench isolation region 22 may reduce or prevent optical crosstalk and electrical crosstalk between adjacent structures 50 in the pixel array. The deep trench isolation region 22 extends fully through the semiconductor layer 12 and the semiconductor layer 10a from the surface 60 to the surface 62.

In use, the p-n junction between the deep well 28 and the shallow well 30 is reverse-biased above the breakdown voltage. The structure 50 is illuminated by light, which is focused by the micro-lens 56 toward the surface 62. Incident photons are absorbed in the portions of the semiconductor layers 10a, 12 interior of the deep trench isolation region 22. When an incident photon is absorbed, an electron-hole pair is created, and an avalanche current is generated under the reverse bias by the creation of additional electron-hole pairs through impact ionization with atoms of the semiconductor material. The current continues to flow until the avalanche is quenched by lowering the bias to less than or equal to the breakdown voltage. The collected avalanche current provides a detectable electronic signal. In order to be able to detect another photon, the reverse bias is raised again above breakdown voltage.

The Bragg mirror defined by the deep trench isolation region 22 provides optical isolation for incident photons, and also provides electrical isolation for the avalanche current. The layers 18, 20 may contain different dielectric materials, which may permit the Bragg mirror to be exclusively fabricated by front-end-of-line processing. The deep trench isolation region 22 lacks a metallic reflector core fabricated using a metal fill during back-end-of-line processing, which may reduce metallic contamination by its elimination and, thereby, reduce the dark current and improve light sensitivity and the signal-to-noise ratio during operation.

In alternative embodiments, the deep trench isolation region 22 may be utilized as deep trench isolation in a different type of photodetector than a single-photon avalanche diode. For example, the deep trench isolation region 22 may be utilized to provide electrical and optical isolation for a photodiode or an avalanche diode.

Figure 7:
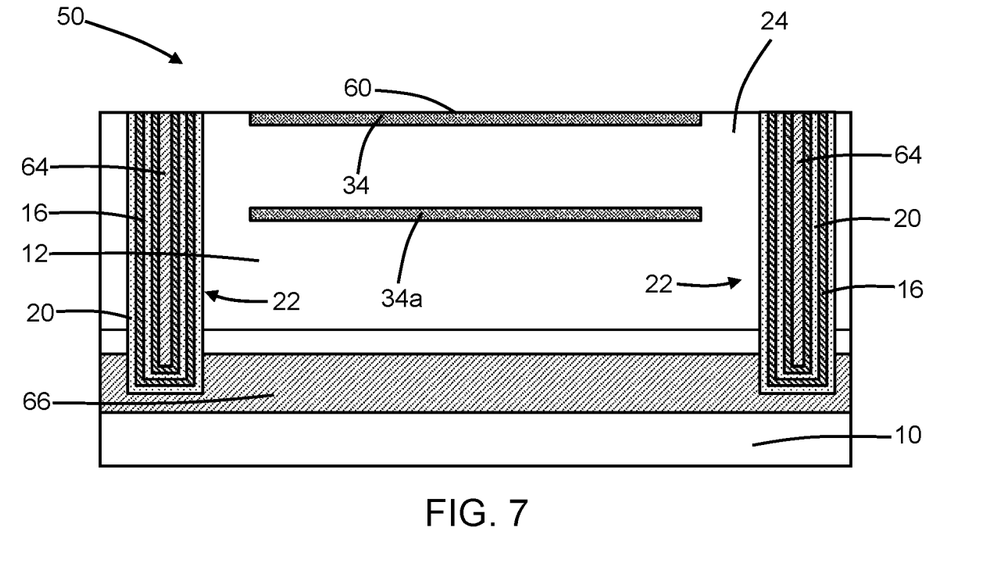
FIG. 7 is a cross-sectional view of a structure in accordance with alternative embodiments of the invention.

With reference to FIG. 7 and in accordance with embodiments of the invention, \ an additional doped region 34a similar to doped region 34 may be formed in the semiconductor layer 12. The deep trench isolation region 22 may also be modified to add a conductive core 64 comprised of a highly-doped polysilicon and a doped layer 66 having an opposite conductivity type from the doped regions 34, 34a. The single-photon avalanche diode includes an absorption region between the doped region 34 and the doped region 34a, and a separate avalanche region between the doped region 34a and the doped layer 66.

The conductive core 64 may be arranged inside the trench 14 interior of the layers 18, 20. The doped layer 66 may be comprised of doped semiconductor material. In an embodiment, the semiconductor material constituting the doped layer 66 may be heavily-doped with an n-type dopant (e.g., arsenic or phosphorus) that provides n-type conductivity. The deep well 26 is eliminated from the device construction, which effectively widens the absorption and multiplication regions, and therefore increases the fill factor. In addition, the deep well 28 and the shallow well 30 are also eliminated from the structure 50.

Figure 8:
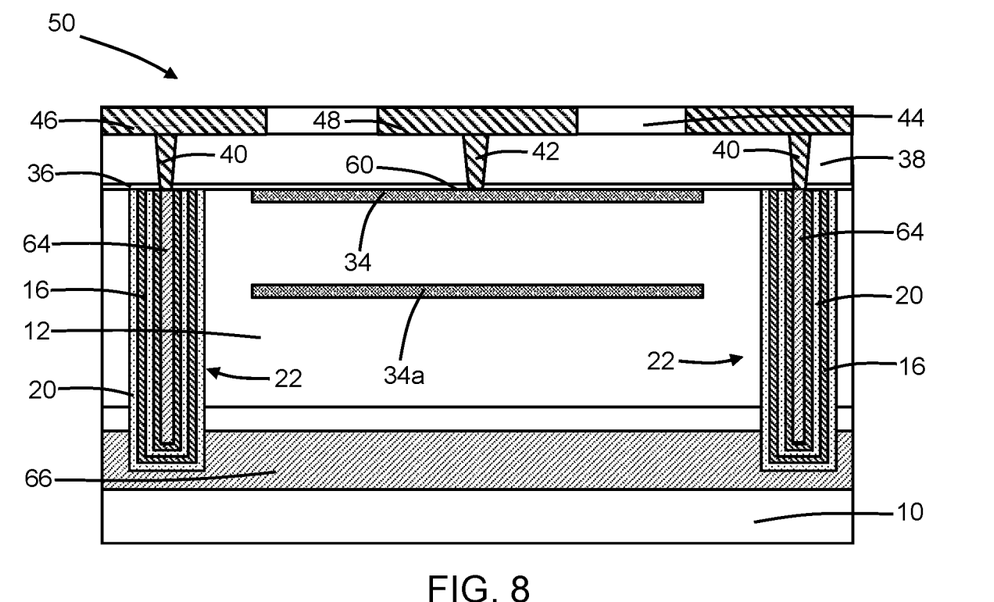
FIG. 8 is a cross-sectional view of the structure at a fabrication stage subsequent to FIG. 7.

With reference to FIG. 8 in which like reference numerals refer to like features in FIG. 7 and at a subsequent fabrication stage of the processing method, the dielectric layer 36 and the interlayer dielectric layers 38 are formed. The contacts 40 are connected to the conductive core 64 of the deep trench isolation region 22.

Processing may continue as shown in FIG. 6 to form a back-side illuminated single-photon avalanche diode.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a photodetector, the structure comprising:
    a first semiconductor layer including a p-n junction;
    a second semiconductor layer having an interface with the first semiconductor layer; and
    a deep trench isolation region in a trench with a plurality of sidewalls extending fully through the first semiconductor layer and the second semiconductor layer, the deep trench isolation region including a first plurality of layers and a second plurality of layers positioned in the trench, the second plurality of layers alternating with the first plurality of layers to define a Bragg mirror, the first plurality of layers comprising a first material having a first refractive index, and the second plurality of layers comprising a second material having a second refractive index that is greater than the first refractive index,
    wherein each of the first plurality of layers includes a first portion extending down the plurality of sidewalls of the trench and a second portion extending across the trench to provide a first U-shape, and each of the second plurality of layers includes a first portion extending down the plurality of sidewalls of the trench and a second portion extending across the trench to provide a second U-shape.

2. The structure of claim 1 further comprising:
    a third semiconductor layer on the plurality of sidewalls of the trench,
    wherein the third semiconductor layer defines a pinning layer that is positioned between the deep trench isolation region and the first semiconductor layer surrounding the plurality of sidewalls of the trench.

3. The structure of claim 2 wherein the first material is a first dielectric material, the second material is a second dielectric material, the third semiconductor layer has a third refractive index, the third refractive index is greater than the first refractive index, and the third refractive index is greater than the second refractive index.

4. The structure of claim 2 wherein the first semiconductor layer includes a well, and the third semiconductor layer is coupled to the well.

5. The structure of claim 2 wherein the third semiconductor layer contains a single-crystal semiconductor material.

6. The structure of claim 1 wherein the first material is a first dielectric material, and the second material is a second dielectric material different from the first dielectric material.

7. The structure of claim 6 wherein the first dielectric material and the second dielectric material are selected from the group consisting of silicon dioxide, aluminum oxide, hafnium oxide, tantalum oxide, and titanium oxide.

8. The structure of claim 1 wherein the first material is a first dielectric material, the second material is a second dielectric material, the first semiconductor layer has a third refractive index, the third refractive index is greater than the first refractive index, and the third refractive index is greater than the second refractive index.

9. The structure of claim 1 wherein the first material is a dielectric material, and the second material is a semiconductor material.

10. The structure of claim 1 wherein each of the first plurality of layers has a first thickness that ranges from about 20 nanometers to about 500 nanometers, and each of the second plurality of layers has a second thickness that ranges from about 20 nanometers to about 500 nanometers.

11. The structure of claim 1 wherein the deep trench isolation region includes a conductive core that is surrounded by the first plurality of layers and the second plurality of layers of the Bragg mirror.

12. The structure of claim 11 where the first material is a first dielectric material, the second material is a second dielectric material different from the first dielectric material, the first dielectric material and the second dielectric material are selected from the group consisting of silicon dioxide, aluminum oxide, hafnium oxide, tantalum oxide, and titanium oxide, and the conductive core comprises a doped semiconductor material.

13. The structure of claim 1 wherein the second semiconductor layer and the first semiconductor layer have a conductivity type, and the second semiconductor layer has a higher dopant concentration than the first semiconductor layer.

14. The structure of claim 13 further comprising:
    a third semiconductor layer on the plurality of sidewalls of the trench,
    wherein the third semiconductor layer defines a pinning layer that is coupled to the first semiconductor layer and the second semiconductor layer.

15. The structure of claim 13 wherein the second semiconductor layer has a surface opposite from the interface, and further comprising:

a micro-lens positioned on the surface of the second semiconductor layer, wherein the second semiconductor layer is positioned between the first semiconductor layer and the micro-lens.

16. The structure of claim 13 wherein the first semiconductor layer includes a first well and a second well defining the p-n junction with the first well.

17. The structure of claim 1 wherein the trench has a trench bottom, the second portion of each of the first plurality of layers extends across the trench bottom, the second portion of each of the second plurality of layers extends across the trench bottom, the first plurality of layers with the first U-shape and the second plurality of layers with the second U-shape are arranged to progressively narrow a space inside the trench.

18. A method of forming structure for a photodetector, the method comprising:

forming a first semiconductor layer and a second semiconductor layer having an interface with the first semiconductor layer;

forming a p-n junction in the first semiconductor layer;

forming a trench with a plurality of sidewalls extending fully through the first semiconductor layer and the second semiconductor layer; and forming a deep trench isolation region in the trench that includes a first plurality of layers and a second plurality of layers positioned in the trench, wherein the second plurality of layers alternate with the first plurality of layers to define a Bragg mirror, the first plurality of layers comprise a first material having a first refractive index, the second plurality of layers comprise a second material having a second refractive index that is greater than the first refractive index, each of the first plurality of layers includes a first portion extending down the plurality of sidewalls of the trench and a second portion extending across the trench to provide a first U-shape, and each of the second plurality of layers includes a first portion extending down the plurality of sidewalls of the trench and a second portion extending across the trench to provide a second U-shape.

19. The method of claim 18 further comprising:

forming a third semiconductor layer on the plurality of sidewalls of the trench, wherein the third semiconductor layer defines a pinning layer that is positioned between the deep trench isolation region and the first semiconductor layer surrounding the plurality of sidewalls of the trench.

20. The method of claim 18 wherein the first material is a dielectric material, and the second material is a semiconductor material.

* * * * *